(12) United States Patent
Walter

(10) Patent No.: US 7,042,320 B2
(45) Date of Patent: May 9, 2006

(54) METHOD FOR MECHANICAL STABILIZATION OF TUBE-SHAPED SUPERCONDUCTING CERAMICS AND MECHANICALLY STABILIZED TUBE-SHAPED SUPERCONDUCTING COMPOSITE

(75) Inventor: Heribert Walter, Erftstadt (DE)

(73) Assignee: Nexans, Paris (FR)

( * ) Notice: Subject to any disclaimer, the term of this patent is extended or adjusted under 35 U.S.C. 154(b) by 0 days.

(21) Appl. No.: 11/119,338

(22) Filed: Apr. 29, 2005

(65) Prior Publication Data

US 2006/0044092 A1   Mar. 2, 2006

(30) Foreign Application Priority Data

May 4, 2004   (EP)   ................... 04010555

(51) Int. Cl.
*H01F 6/00*   (2006.01)

(52) U.S. Cl. .................. 335/216; 174/15.5; 29/599; 505/220; 505/706; 505/917

(58) Field of Classification Search ............... 505/220, 505/706, 879, 884–887, 917, 925; 29/599; 335/216; 174/15.4, 15.5, 125.1
See application file for complete search history.

(56) References Cited

U.S. PATENT DOCUMENTS

| | | | |
|---|---|---|---|
| 5,294,601 A | 3/1994 | Bock et al. ..................... 505/1 |
| 5,389,605 A | 2/1995 | Bock et al. ................. 505/350 |
| 5,742,217 A * | 4/1998 | Bent et al. ................... 335/216 |
| 6,339,194 B1 * | 1/2002 | Larsen et al. ............ 174/125.1 |
| 6,574,852 B1 * | 6/2003 | Zhou .......................... 29/599 |

FOREIGN PATENT DOCUMENTS

EP   0462409   12/1991

\* cited by examiner

*Primary Examiner*—Ramon M. Barrera
(74) *Attorney, Agent, or Firm*—Sofer & Haroun, LLP

(57) ABSTRACT

A method for mechanical stabilisation of a superconducting composite having a tube-shaped superconducting ceramic and a reinforcing pipe introduced into each other by pre-stressing the tube-shaped superconducting ceramic by applying compressive force on one end of the tube as well as to a pre-stressable superconducting composite.

18 Claims, 3 Drawing Sheets

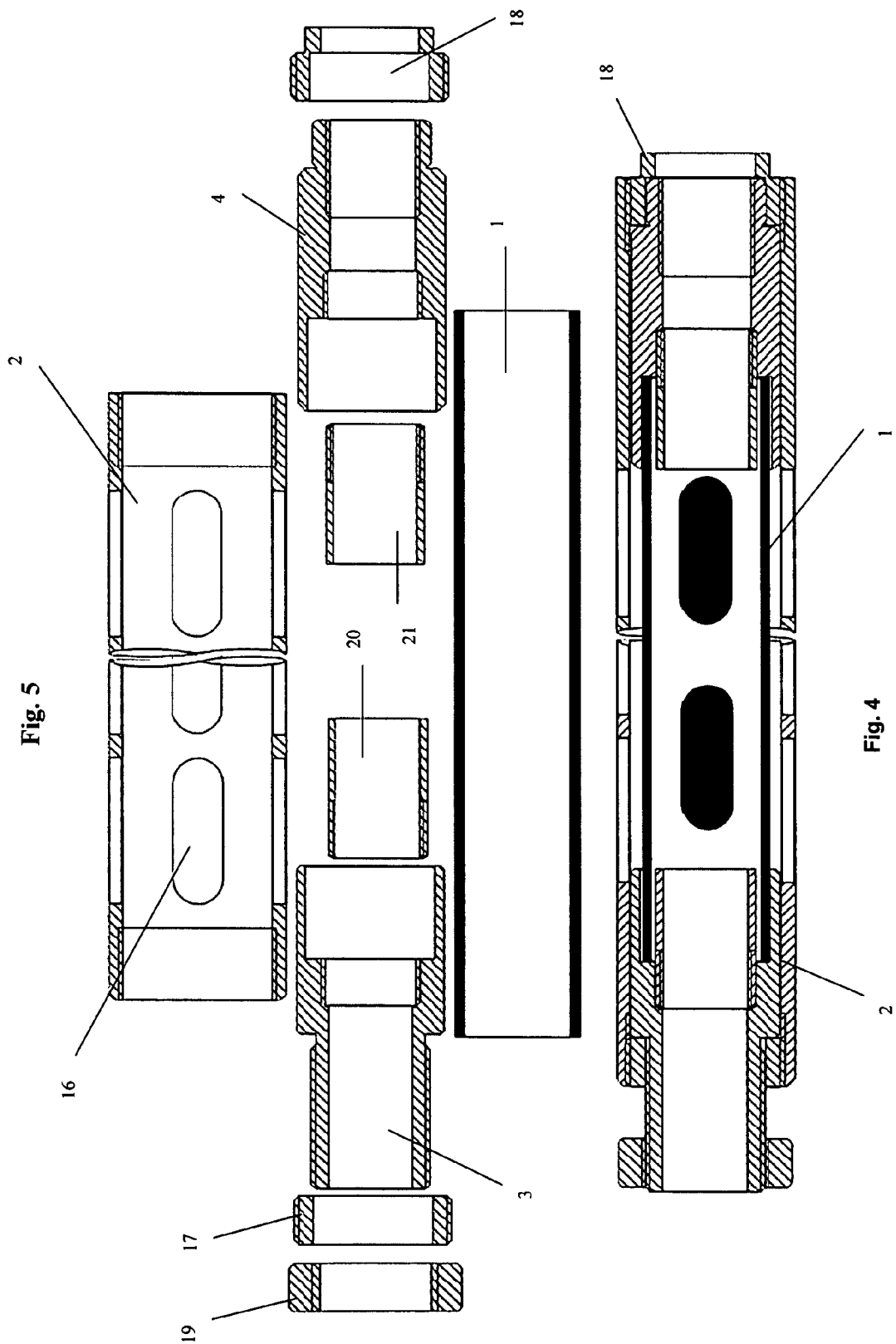

METHOD FOR MECHANICAL STABILIZATION OF TUBE-SHAPED SUPERCONDUCTING CERAMICS AND MECHANICALLY STABILIZED TUBE-SHAPED SUPERCONDUCTING COMPOSITE

RELATED APPLICATION

This application is related to and claims the benefit of priority from European Procedures Patent No. 04 010 555.3, filed on May 4, 2004, the entirety of which are incorporated herein by reference.

FIELD OF THE INVENTION

The present invention relates to a process for mechanical stabilization of tube-shaped superconducting ceramics, in particular of tube-shaped superconducting ceramics for high temperature superconducting (htsc) applications as well as a tube-shaped superconducting composite stabilized in accordance to the present method.

BACKGROUND OF THE INVENTION

Ceramics are generally known to be brittle and liable to damage.

The present invention relates to superconducting ceramics including htsc ceramics. In particular the present invention relates to htsc ceramics based on bismuth-(lead)-strontium-calcium-copper-oxides (referred to as Bi2223 and Bi2212, and PbBi2223 and PbBi2212, respectively) and rare-earth element(s)alkaline earth element(s)-copper-oxides (referred to as YBCO 123 and YBCO 211). Such superconducting ceramics as well as composition and structure thereof and process for preparation thereof are well known.

Tube-shaped hollow bodies made of such superconducting materials are widely used in superconducting applications. It is well known to use tube-shaped superconducting hollow bodies made of, for example, Bi2212 in htsc current limiters and current leads to low temperature devices.

For example, current limiters based on Bi2212 tubes are disclosed in Patent Application No. 0 573 798 and 0 524 442 which by reference is incorporated herein.

Such htsc tubes are obtainable by a well known melt casting process, preferably by centrifugal casting process as disclosed for example in European Patent Application No. 0 462 409 also incorporated herein by reference.

In general, for use in current limiters and current leads, respectively, both ends of the htsc tubes are provided with contact surfaces that are preferably formed of silver.

Usually, metallic elements are attached to the contact surfaces, said metallic elements serving as connection of the htsc tube to the current supply.

There exists the problem that by the weight of the metallic elements, in particular in addition with the weight of current supplies connected thereto, a bending moment is generated on the htsc tube. Further, when supplied with current on both ends of the htsc tube moments are acting caused by Lorentz forces. Due to these forces acting on the htsc tube damage or even breakage of the htsc tube can occur.

For stabilising the htsc tubes against these forces it is known to introduce a reinforcing pipe made of non-conducting or only poorly conducting material, e.g. glass fibre reinforced plastics, into the htsc tube.

For stabilization purposes the reinforcement pipe is fastened to the metallic elements and to the surface of the htsc tube, respectively, for example by sticking, screwing and soldering, respectively. In particular, the inner surface of the htsc tube and the outer surface of the reinforcing pipe have to be connected tightly to each other.

In operation the thus obtained composite is subjected to significant temperature changes resulting in volume changes of the components of the composite. In order to avoid damage of the htsc ceramics due to different volume changes during temperature change it is necessary to adjust the thermal expansion coefficients of the material used both in radial and axial direction.

There is a disadvantage that selection of materials with suitable thermal expansion coefficients are restricted by the material requirements of the specific application.

Furthermore, during cooling not only deformation of the reinforcing pipe has been observed but also generation of radial cracks in the htsc tube.

OBJECTS AND SUMMARY OF THE INVENTION

Further, overall improvement of the mechanical stability of the composite was desirable. In particular, a method was desirable for rendering the composite more resistant to volume changes caused by differences in the thermal expansion coefficient.

In general, by the present invention, mechanical stabilization of the ceramic tube is obtained by pre-stressing the tube by applying a compressive force on one end of the tube acting in direction to the other end.

Thus, by the present invention a method for mechanical stabilization of a superconducting composite is provided said superconducting composite comprising a tube-shaped superconducting ceramic provided with contact surfaces and metallic elements attached to the contact surfaces at both ends of the tube-shaped superconducting ceramic and a reinforcing pipe, introduced into each other, wherein the tube-shaped superconducting ceramic is pre-stressed in axial direction by applying a compressive force on one end of the tube shaped superconducting ceramic, said compressing force acting in direction of the other end, and applying tensile stress on the reinforcing pipe.

According to a further aspect the present invention is directed to a pre-stressable superconducting composite comprising a tube-shaped superconducting ceramic and a reinforcing pipe, introduced into each other.

For the purposes of the present invention the term "tube-shaped superconducting ceramics" hereinafter is also referred to as "superconducting tube" or "sc tube".

Furthermore, if not indicated otherwise, the term "superconducting" and "sc", respectively includes also "high temperature superconducting" and "htsc", respectively.

For applying compressive force on the sc tube as well as tension on the reinforcing pipe suitable means are provided at the respective end of the composite. For example clamping means or similar means are provided.

BRIEF DESCRIPTION OF THE DRAWINGS

In the following the present invention is explained in more detail by reference to the attached figures which are for illustration purposes only in order for a better understanding of the invention.

It is shown in

FIG. 2 components of the composite in accordance to FIG. 1 wherein

FIG. 4 a further embodiment of the pre-stressable superconducting composite of the present invention in the assembled state; and FIG. 5 components of the composite of FIG. 4.

DETAILED DESCRIPTION

Figure 1:
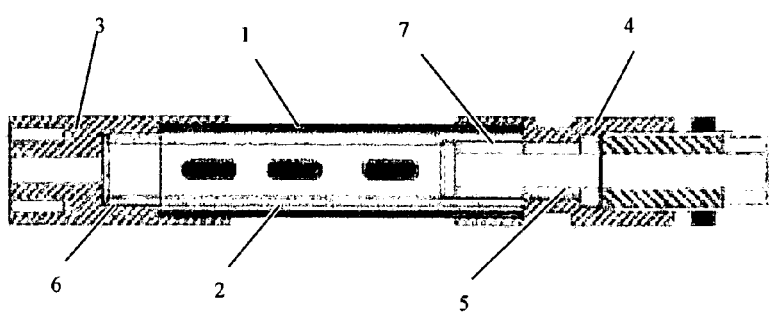
FIG. 1 a composite according to a preferred embodiment of the present invention comprising a superconducting tube usable for a fault current limiter.

The construction shown in FIG. 1 is directed to a superconducting composite used in fault current limiters comprising a Bi2212 tube reinforced with a reinforcing pipe made of glass fibre reinforced plastics with metallic elements 3, 4 made of Cu.

In this embodiment the reinforcing pipe is stuck into the sc-tube.

However, as is clear for those skilled in the art, the principles of the present invention explained with reference to the specific embodiment of FIG. 1, is applicable to any sc application using tube-shaped superconducting hollow bodies reinforced with a reinforcing element. For example such wherein the sc-tube is stuck into the reinforcing pipe and/or wherein other sc ceramics, in particular, htsc ceramics, suitable conductive materials such as metals for the metal elements and other non conducting or only poorly conducting materials for the reinforcing element can be used without being restricted to the specific example set out above.

As shown in FIG. 1 the reinforcing pipe 2 is introduced into the Bi2212 tube 1. Consequently, the diameter of the reinforcing pipe 2 is smaller than that of the Bi2212 tube. Further, the reinforcing pipe 2 has a longer length than the sc tube. The reinforcing pipe 2 is introduced into the sc tube 1 in such a manner, that the reinforcing pipe 2 projects over one end (here the left end) of the sc tube. At the opposite end (here end on the right side) the edges of the sc tube 1 and of reinforcing pipe 2 are essentially flushing.

The metallic element 3 is put on the protruding end of the reinforcing pipe 2 and part of the end of the sc tube 1 as shown in FIG. 1. To this the metallic element 3 is provided with a bore hole having different diameters. The diameter of the part embracing the sc tube 1 is larger than the diameter of the inner part, which embraces the end of the reinforcing pipe 2 protruding over the end of the sc tube 1. At the transition from the larger diameter to the reduced diameter a step is formed preventing the sc tube 1 from protruding deeper into the bore hole of the metallic element 3.

The sc tube 1 and the metallic element 3 can be fixed to each other, e.g. by soldering. For soldering a solder can be used suitable for such htsc applications, for example binary compounds such as SnPb, SnZn, InZn, InAg, BiSn, AuSn, SnCd, SnAg, InSn, SnSb and SnCu. Further ternary or quaternary compounds and alloys of these compounds can be used.

Figures 2A, 2B, 2C, 2D:
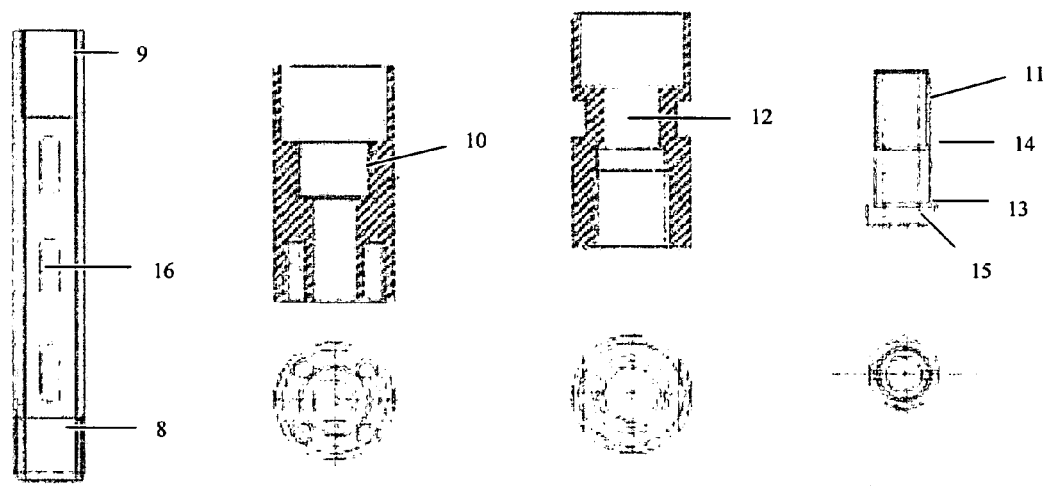
FIG. 2a is a reinforcing pipe.
FIG. 2b the metallic element of the end of the sc tube in which direction the compressive force acts.
FIG. 2c the metallic element of the end of the htsc tube on which compressive force is applied.
FIG. 2d a clamping bolt.

As shown in FIGS. 2a and 2b the end of the reinforcing pipe 2 protruding into the part with the reduced diameter of the bore hole of the metallic element 3 is provided with a outer thread 8 fitting to an inner thread 10 of the metallic element 3 so that the reinforcing pipe 2 and the metallic element 3 can be fixed to each other by screwing as indicated by screwing area 6 in FIG. 1.

Now, the construction of the other end, the right end in FIG. 1, of the composite for the fault current limiter shown in FIG. 1 will be explained. It is this end on which the compressive force is subjected to the sc tube. Thus, the compressive force is acting in direction to the left end which construction is explained above.

As shown in FIG. 2c the metallic element 4 has a bore hole with an inner portion 12 of reduced diameter. By the reduction of diameter steps are formed at the transition from the wider to the smaller diameter at both ends of the inner portion 12 with reduced diameter.

As the metallic element 3 the metallic element 4 is put on the sc tube 1 with the reinforcing pipe introduced therein. At this end of the composite both the end of the sc tube 1 as well as the end of the reinforcing pipe 2 essentially have the same length and both ends are mounted on the step formed in the metallic element 4 at the transition from the wider to the reduced diameter.

In this embodiment a clamping bolt 5 is used as clamping means. The clamping bolt 5 is partially introduced into the hollow interior at the end portion of the composite on the right side in FIG. 1 and is jointed with the inner surface of reinforcing pipe 2 at this portion.

As shown in FIG. 2d the clamping bolt 5 is composed of a shank 14 and a head 15 wherein the diameter of the head 15 is larger than that of the shank 14.

As is the case with the metallic elements 3, at the transition between the head 15 and the shank 14 with reduced diameter a step 13 is formed.

Referring to FIG. 1 the smaller diameter of the shank 14 of the clamping bolt 5 is chosen in a manner to fit to the reduced diameter of the inner portion 12 of the metallic element 4. The wider diameter of the head 15 of the clamping bolt 5 is chosen in a manner to be wider than the reduced diameter of the clamping bolt 5 so that the step 13 of the clamping bolt 5 abuts against the step of the metallic element 4 formed at the transition from the portion with wider diameter to the inner portion 12 with reduced diameter.

That is, as shown in FIG. 1, the inner diameters of the reinforcing pipe 2, of the portion 12 with reduced diameter of metallic element 4 as well as the outer diameter of the shank 14 of the clamping bolt 5 correspond to each other.

As shown in FIG. 2d the end portion of the clamping bolt 5 protruding into the reinforcing pipe 2 can be provided with an outer thread 11. Accordingly, the respective end portion of the reinforcing pipe 2 can be provided with an inner thread 9. Reference number 7 in FIG. 1 indicates the screwing area between reinforcing pipe 2 and clamping bolt 5 at which the reinforcing pipe 2 and the clamping bolt 5 are screwed to each other.

On jointing reinforcing pipe 2 and clamping bolt 5 by screwing tension is exerted on the reinforcing pipe 2 axially in direction to the right end side of the composite.

As set out above, when the sc tube 1 with the introduced reinforcing pipe 2 is assembled with the metallic element 3 the edges of sc tube 1 and reinforcing pipe 2 at the opposite end (right end in FIG. 1) are in essentially the same height, that is, these edges are essentially flushing with each other. "Essentially" here means that the edge of the sc tube protrudes a little bit over the edge of the reinforcing pipe 2.

For example, in the assembled state of sc tube 1, reinforcing pipe 2 and metallic element 3 the edge of sc tube 1 can protrude about $\frac{2}{10}$ mm over the edge of reinforcing pipe 2.

Due to this small protrusion compressive force is exerted on sc tube 1 by metallic element 4 when the clamping bolt 5 is jointed to the reinforcing pipe 2, e.g. by screwing as in this embodiment.

That is, in the assembled state both metallic elements 3, 4 are supported to each other via the sc tube 1, thereby subjecting the reinforcing pipe 2 to tensile stress and the sc tube to compressive force in direction opposite to each other.

As at the left end side soldering can be provided between the outer surface of the sc tube 1 and the inner surface of the metallic element 4 at the overlapping portion.

As is clear from the above, the selection of the diameters of the respective components of the present composite depends on the respective diameters of the sc tube and the reinforcing pipe 2.

Further, the length of protrusion of the sc tube 1 over reinforcing pipe 2 can be varied according to need.

When screwing the metallic element with the reinforcing pipe 2 rotary motion might result between reinforcing pipe 2 and the metallic elements. This is particularly relevant at the side of metallic element 4 in the embodiment referred to above.

That rotary motion in turn might cause a torsion moment on the sc tube 1 which adversely affects the sc tube made of a ceramic.

Thus, preferably, means are provided preventing any rotary motion of the reinforcing pipe against the metallic element. For example, as shown in FIG. 3, the step of metallic element supporting reinforcing pipe 2 can be provided with at least one recess matching with a corresponding projection at the end edge of reinforcing pipe 2 so that when assembled the projection of the end edge of reinforcing pipe 2 matches with the recess in the step.

Figure 3:
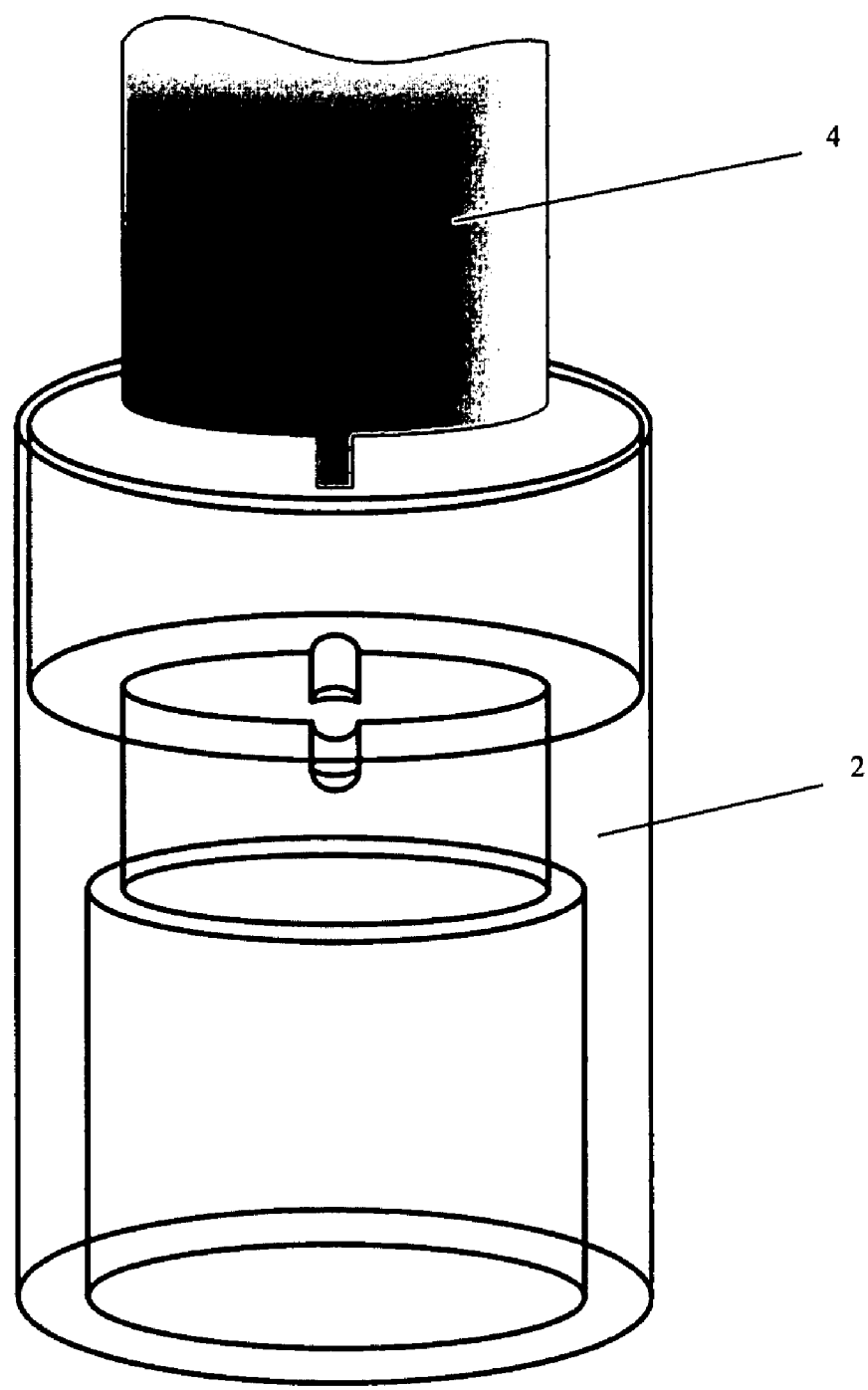
FIG. 3 a preferred embodiment of the pre-stressable superconducting composite of the present invention.

The recess can be in form of a notch extending across the width of the wall of metallic element as shown in FIG. 3. However, any other form and orientation of the recess as well as of the matching projection can be applied. It is also possible that the recess is provided on the end edge of reinforcing pipe 2 and the projection on the step.

When the projection extends into the recess rotary motion of the reinforcing pipe 2 against the metallic element is prevented.

For htsc applications sufficient cooling of the superconducting components is necessary.

To this, the bore holes in the metallic elements 3, 4 are through holes allowing cooling medium such as nitrogen to be passed through and to expand on warming up.

Also the clamping bolt 5 can be provided with a through hole in order to allow passing and expanding of the cooling medium.

Further, the inner diameter of the sc tube 1 and the outer diameter of the reinforcing pipe 2 are selected such that a small gap is formed between the inner surface of the sc tube 1 and the outer surface of the reinforcing pipe 2 in order to allow the cooling medium to flow.

For the embodiment according to the figures of the present specification a gap of about 2 mm is sufficient. Accordingly, contrary to the prior art for the present invention the surfaces of the sc tube 1 and the reinforcing pipe 2 are not fastened tightly together.

For better cooling the wall of the reinforcing pipe 2 can be provided with openings 16, the shape and number of these openings 16 are not particularly restricted but can be selected according to need.

As indicated in FIGS. 1, 2*b* and 2*c* the ends of the metallic elements 3, 4 opposite to the ends connected to the composite can be provided with suitable means for connecting the composite to further devices such as current supply and low temperature devices.

When the clamping bolt 5 is tightened compression is exerted on the sc tube and, simultaneously, tension is applied on the reinforcing pipe 2, thereby pre-stressing the present superconducting composite.

In general, the dimensions of the components of the present composite such as e.g. the length and the width can be selected according to need taken into consideration the above disclosed functions.

For example in the embodiment of FIG. 1 the length of the reinforcing pipe is about 225 mm.

The specific embodiment according to FIG. 1 is particularly suitable for tubes with thin walls of a width of about 1,5 mm.

As set out above the present invention relates also to embodiments wherein it is the sc-tube 1 which is stuck into the reinforcing pipe 2.

Here the same principles apply as set out above for the embodiment shown in FIG. 1. Suitable modifications and variations of the specific construction are within the normal routine work of the person skilled in the art without further ado.

An example for such an embodiment of the present invention is shown in FIG. 4 and FIG. 5.

In this embodiment the reinforcing pipe is stuck onto the sc tube.

In FIG. 4 the superconducting composite in the assembled state and in FIG. 5 the single components of the assembled superconducting composite are shown.

As in the embodiment of FIG. 1 metallic elements 3, 4 are provided at each end of the sc tube 1 wherein each end of the sc tube 1 is within the hollow interior of the respective metallic elements 3, 4. Within each metallic element means are provided for supporting each end of the sc tube 1 and for preventing the sc tube 1 from moving deeper into the respective metallic element. For example, as already shown above a step or projection can be formed by reduction of inner diameter of the metallic element.

Onto the assembly of sc tube 1 and metallic elements 3, 4 the reinforcing pipe 2 is provided. In this embodiment the reinforcing pipe 2 has a length exceeding both ends of the sc tube 1 and overlapping at least partially with the metallic elements 3, 4.

The end of reinforcing pipe 2 overlapping with metallic element 3 (left end side of FIG. 4) is fixed to the outer wall of metallic element 3 at this position so that no further movement along the length is possible.

For fixing any suitable means can be used for example soldering, bonding, screwing etc.

A preferred method for fixing is shown in FIG. 4. As shown in FIG. 4 the outer diameter of metallic element 3 can be reduced thereby leaving a gap between the inner surface of the end of reinforcing pipe 2 and the outer surface of metallic element 3. A fixing ring 17 having matching diameters and an outer thread can be provided for connection with a corresponding inner thread of the protruding end of reinforcing pipe 2.

It is not necessary to provide a fastening between the outer surface of metallic element 3 and the inner surface of fixing ring 17.

At the end with metallic element 4 the reinforcing pipe 2 is attached to the metallic element 4 by means suitable to exert compressive force on the sc tube 1 in direction to the end of metallic element 3 and, simultaneously, tensile stress to the reinforcing pipe 2 in the opposite direction.

For example, in the embodiment of FIG. 4 a ring 18 with outer thread is used as clamping means (hereinafter referred to clamping ring 18).

Like the design at the end with metallic element 3, the dimensions of ring 18 are selected to match with a gap provided between the outer surface of metallic element 4 and the inner surface of reinforcing pipe 2, e.g. by reduction of the outer diameter of metallic element 4.

Correspondingly, an inner thread is provided at the respective end of reinforcing pipe 2. By screwing clamping ring 18 with reinforcing pipe 2 pressure is generated on sc tube 1 and tension on reinforcing pipe 2.

As is clear from both embodiments referred to above in detail for illustrating the principle of the present invention, any means or configuration can be used for the present invention capable to act as clamping means, that is providing compressive force on the sc tube 1 and tensile stress on reinforcing pipe 2 in opposite directions.

Both embodiments are of illustrative purpose only and the present invention is not restricted to these specific embodiments.

A further ring 19 can be attached to metallic element 3. Again, any suitable means can be applied for attaching this ring to the end of metallic element 3, for example soldering, bonding etc.

According to the embodiment of FIG. 4 ring 19 is attached to metallic element 3 by screwing by providing respective inner thread within ring 19 and outer thread on the respective part of metallic element 3.

Ring 19 serves for connecting the assembly to further components, devices etc.

All components used in combination with metallic elements 3, 4 such as rings 17, 18 and 19 as well as tubular inserts 20, 21 referred to below in more detail should be made of materials which do not adversely affect the functioning of the sc composite in use. Preferably they are made of the same material as the metallic elements 3, 4, that is there are made of a metal such as copper as used in the specific embodiments explained above.

Preferably, stabilization means can be used for improved connection of sc tube 1 to the metallic elements 3, 4.

As shown in FIG. 4 tubular inserts 20, 21 are suitable examples for such stabilization means.

These tubular inserts 20, 21 are introduced into the metallic elements 3, 4 at the ends directed to the sc tube 1 to a position at which the front parts of the tubular inserts overlaps with the inner surface of the metallic element and the rear part of the tubular inserts overlaps with the end part of sc tube 1 as inserted into the metallic elements 3, 4 as shown in FIG. 4.

The inner and outer diameter of the tubular inserts 20, 21 are selected to match with the respective inner diameters of the metallic elements 3, 4.

The length of the tubular inserts 20, 21 is not particularly critical as long as a suitable extent of overlap is provided for stabilization. For example, preferably the rear end of the tubular inserts flashes with the corresponding end of the metallic elements 3, 4.

Preferably, a spacing is formed between the inner surface of the end of sc tube 1 and the outer surface of tubular inserts 20, 21. In this case, the spacing can be filled with a suitable means for fixing of the sc tube 1, for example an adhesive, solder etc. Suitable solders and adhesives for low temperature application are known to those skilled in the art. For example, solders can be used as mentioned above.

The solder, adhesive etc. used should be sufficiently electrically conducting to ensure electrical contact.

Due to the stresses generated the following advantages are obtained in the composite of the present invention.

By the tensile stress applied on the reinforcing pipe 2 deformation of the reinforcing pipe 2 during cooling, e.g. in liquid nitrogen, is prevented.

Without pre-stressing, on cooling deformation of the reinforcing pipe 2 is liable to occur causing axial bending of the sc tube 1. If the composite of sc tube 1, reinforcing pipe 2 and metallic element 3, 4 is not pre-stressed deformation of the reinforcing pipe 2 results in breakage of the ceramic superconducting tube 1.

To the contrary, when the composite is pre-stressed a force must be generated by the reinforcing pipe 2 acting against the tensile stress in order to allow the tube 1 to be axially bended. For avoiding deformation of the reinforcing pipe 2 the composite is preferably adjusted in a manner that the force resulting from the bending moment of the reinforcing pipe 2 does not exceed the applied tensile stress.

By the compressive stress applied on the ceramic sc tube 1 radial cracks of the ceramic sc tube are avoided which might otherwise result from uneven thermal expansion coefficients of the reinforcing pipe 2 and the superconducting ceramic tube 1 at the cooling and warming up steps.

Although not specifically described herein our illustrated in the drawings, numerous modifications and variations of the present invention are possible in light of the above disclosure. It is therefore to be understood that within the scope of the invention defined in the appended claims the invention may be practiced otherwise than as specifically described herein.

The invention claimed is:

1. A Method for mechanical stabilization of a superconducting composite with said superconducting composite having a tube-shaped superconducting ceramic tube provided with contact surfaces said method comprising the steps of:
   attaching a first and second metallic element to the contact surfaces at both ends of the superconducting ceramic tube;
   inserting a reinforcing pipe into said superconducting ceramic tube; and
   pre-stressing said superconducting ceramic tube in an axial direction by applying compressive force on one end of the superconducting ceramic tube, said compressing force acting in direction to the other end, and applying tensile stress on the reinforcing pipe.

2. Method according to claim 1, wherein for pre-stressing, both metallic elements are supported on each other via the superconducting ceramic tube.

3. Method in accordance to claim 1,
   wherein the superconducting ceramic tube is made of a high temperature superconducting material.

4. Method according to claim 3,
   wherein the high-temperature superconducting material is selected from Bi 2212 and PbBi 2212.

5. Method according to claim 1,
   wherein the diameter of the reinforcing pipe and the diameter of the superconducting ceramic tube are chosen so that in the assembled state, a gap is left between the reinforcing pipe and the superconducting ceramic tube.

6. Method according to claim 1,
   wherein one end of the reinforcing pipe is fixed to one of the metallic elements and tension is exerted on the opposite end of the reinforcing pipe.

7. Method according to claim 6,
further comprising the step of exerting tension by fixing a clamping means to said end of the reinforcing pipe opposite to the end fixed to said one of the metallic elements.

8. Method according to claim 7,
wherein the clamping means is a clamping bolt.

9. Method according to claim 1,
wherein the reinforcing pipe is introduced into the superconducting ceramic tube.

10. Pre-stressable superconducting composite comprising:
a tube-shaped superconducting ceramic tube provided with contact surfaces;
metallic elements attached to the contact surfaces at both ends of the superconducting ceramic tube;
a reinforcing pipe, wherein said superconducting ceramic tube and reinforcing pipe being inserted into each other, wherein in the assembled state one end of the reinforcing pipe is jointed to one of the metallic elements, the end of the superconducting ceramic tube opposite thereto being attached to a second metallic element; and
wherein a clamping means is provided connecting said second metallic element and the reinforcing pipe.

11. Pre-stressable superconducting composite according to claim 10,
wherein the clamping means is a clamping bolt.

12. Pre-stressable superconducting composite according to claim 10, wherein the metallic elements are provided with through holes.

13. Pre-stressable superconducting composite according to claim 10,
wherein the reinforcing pipe is introduced into the superconducting ceramic tube.

14. Pre-stressable superconducting composite according to claim 10,
wherein the superconducting ceramic tube is introduced into the reinforcing pipe.

15. Pre-stressable superconducting composite according to claim 10,
wherein the clamping means is jointed to the interior of the end portion of the reinforcing pipe by screwing.

16. Pre-stressable superconducting composite according to claim 10,
wherein the first metallic element and the reinforcing pipe are jointed to each other by screwing.

17. Pre-stressable superconducting composite according to claim 10,
wherein means are provided for preventing rotary motion of reinforcing pipe and metallic element against each other.

18. Use of a pre-stressable superconducting composite according to claim 10 in fault current limiters and in current leads.

* * * * *